(12) United States Patent
Yamasaki

(10) Patent No.: US 6,433,422 B1
(45) Date of Patent: Aug. 13, 2002

(54) SEMICONDUCTOR INTEGRATED CIRCUIT HAVING SEMICONDUCTOR PACKAGES FOR MOUNTING INTEGRATED CIRCUIT CHIPS ON BOTH SIDES OF A SUBSTRATE

(75) Inventor: Kyoji Yamasaki, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/440,516

(22) Filed: Nov. 15, 1999

(30) Foreign Application Priority Data

May 31, 1999 (JP) .......................................... 11-152851

(51) Int. Cl.[7] .............................................. H01L 22/34
(52) U.S. Cl. ...................... 257/725; 257/685; 257/723; 257/203; 257/207; 257/210; 257/211; 257/691; 257/724; 257/686; 257/784; 257/786; 257/777; 257/778; 257/737; 257/738
(58) Field of Search ................................ 257/690–693, 257/686, 685, 723, 666, 776, 778, 777, 738, 737, 724, 725, 203, 207, 210, 211, 784, 786

(56) References Cited

U.S. PATENT DOCUMENTS

| | | | | |
|---|---|---|---|---|
| 4,136,356 A | * | 1/1979 | Kusano | |
| 5,332,922 A | * | 7/1994 | Oguchi et al. | 257/723 |
| 5,821,624 A | * | 10/1998 | Pasch | 257/776 |
| 5,949,135 A | * | 9/1999 | Washida et al. | 257/685 |
| 5,990,546 A | * | 11/1999 | Igarashi et al. | 257/700 |
| 6,080,931 A | * | 6/2000 | Park et al. | 257/723 |
| 6,188,127 B1 | * | 2/2001 | Senba et al. | 257/686 |
| 6,278,616 B1 | * | 8/2001 | Gelsomini et al. | 257/686 |

FOREIGN PATENT DOCUMENTS

JP 9-107048 4/1997

* cited by examiner

Primary Examiner—Alexander O. Williams
(74) Attorney, Agent, or Firm—McDermott, Will & Emery

(57) ABSTRACT

A semiconductor integrated circuit disclosed herein are characterized in that: (a) each chip is reduced in size by having electrode pads formed in a plurality of rows, the small-size chip being used to form a small ordinary package; (b) frame wires inside the package are used to interconnect electrode pads and electrode bumps in different manners so that chips are furnished in common, whereby a small-size mirror package is formed; (c) frame wires on one side are arranged to pass alternately between contiguous electrode pads and/or between contiguous frame wires on the other side in order to further reduce common chips in size, whereby electrode pads are formed in a larger number of rows; (d) a substrate is sandwiched by the CSPs thus obtained so as to at least double packaging density; and (e) switches or fuses are provided in layered connection wires inside the chip so that after package fabrication, the manner of interconnecting the internal circuits of the chip and the electrode pads thereof may be changed selectively given a mirror signal.

20 Claims, 13 Drawing Sheets

SEMICONDUCTOR INTEGRATED CIRCUIT HAVING SEMICONDUCTOR PACKAGES FOR MOUNTING INTEGRATED CIRCUIT CHIPS ON BOTH SIDES OF A SUBSTRATE

BACKGROUND OF THE INVENTION

1. Field of the Invention

The present invention generally relates to a semiconductor integrated circuit. More particularly, the invention relates to a semiconductor integrated circuit having semiconductor packages of CSP (chip size package or chip scale package) structure for mounting integrated circuit chips on both sides of a substrate.

2. Description of the Background Art

A CSP structure semiconductor package capable of significantly enhancing packaging density is disclosed illustratively in Japanese Patent Laid-open No. Hei 9-107048. FIG. 12 is a perspective view corresponding to a CSP shown in FIG. 31 of the cited publication. In FIG. 12, reference numeral 9 stands for a CSP in which electrode pads 3 are connected to electrode bumps 1 via frame wiring 2 that forms connection wiring inside the package. The package is mounted on a substrate, not shown, by melting the electrode bumps 1 that serve as external connection electrodes of the CSP 9.

The electrode pads 3 are capable of being formed at anywhere on an integrated circuit chip 8. However, the CSP 9 is required to ease stress applied to integrated circuit elements under electrode bumps 1 when the bumps 1 are being formed or the CSP 9 is getting mounted on the substrate. Thus, there exist a number of constraints on the design of connection wiring for the electrode bumps 1 and of layout positions of the electrode pads 3.

Mounting CSPs on both sides of a substrate involves preparing a pair of CSPs (called the CSP mirror pair hereunder) made of an ordinary package (also called the front side package or reverse mirror package hereunder) to be mounted on the top, i.e., the front side of the substrate, and a back side package (also called the mirror package hereunder) to be attached to the back side of the substrate. Referring to FIG. 13, a CSP mirror pair is illustratively constituted by a CSP 91 and a CSP 92. One of the paired CSPs 91 and 92 serves as the front side CSP and the other as the back side CSP mounted on the respective sides of a module substrate.

The CSP mirror pair is characterized in that a plurality of electrode bumps formed on the principal planes of the front side CSP and back side CSP are arranged symmetrically with respect to the substrate. For example, looking from above the principal plane of the CSP mirror pair in FIG. 13, it is noticed that rows of electrode bumps 1A through 1E and 1N through 1S are located symmetrically between the CSP 91 and CSP 92. The CSP mirror pair may be mounted on both sides of a substrate selected from among diverse kinds of substrates including the module substrate. The front side and back side CSPs are interchangeable as long as they are mounted in pair on the two sides of the substrate.

A majority of conventional CSP mirror pairs are exemplified, as shown in a plane view of FIG. 14, by a CSP mirror pair 100 each package having a row of electrode pads and two rows of electrode bumps. The arrangement has been favored because there are relatively few constraints on the layout of the electrode bumps and because of the ease of installing connection wiring within the packages.

In FIG. 14, a front side chip 103 and a back side chip 104 are formed under the principal planes of a front side package 101 and a back side package 102 respectively. This is a typical CSP structure in which a plurality of electrode pads 3A through 3S are aligned in a row in the middle of the principal plane of each chip. In the structure seen in FIG. 14, the electrode pads 3A through 3E and 3N through 3S are apportioned right and left to be connected to frame wires 2A through 2E and 2N through 2S inside each package. The frame wires are in turn connected to the right- and left-hand side rows of the electrode bumps 1A through 1E and 1N through 1S serving as external connection electrodes of the CSP. The layout permits easy installation of connection wiring.

In FIG. 14, the chips 103 and 104, electrode pads 1 and frame wires 2 are indicated by dash-dot lines and solid lines although they are not actually seen from the principal planes of the packages 101 and 102. The same convention applies to the figures to be referred to hereunder.

High degrees of circuit integration and concentration as well as enhanced functions afforded by memory-logic hybrid circuitry have boosted the capacity of, and the number of pins on, CSPs. Such trends are liable to entail increases in packaging area with electrode pads crowded out of packages because the CSP structure has its electrode pads aligned in a row in the middle of the principal plane of each chip. Reductions in packaging area have failed to keep up with recent years' particularly pronounced advances in miniaturization of circuits inside chips.

SUMMARY OF THE INVENTION

The present invention has been conceived to solve the previously-mentioned problems, and a general object of the present invention is to provide a novel and useful semiconductor integrated circuit.

A more specific object of the present invention is to provide CSPs small in size and fit to be mounted on both sides of a substrate.

It is a second object of the present invention to provide mirror CSPs fit to be mounted on both sides of a substrate, the CSPs accommodating chips having electrode pads and integrated circuits in the same positions.

It is a third object of the present invention to provide mirror CSPs fit to be mounted on both sides of a substrate, the CSPs accommodating chips having integrated circuits in the same positions.

It is a fourth object of the present invention to provide a small, high-density packaging assembly comprising a pair of small mirror CSPs mounted on both sides of a substrate.

The above objects of the present invention are achieved by a semiconductor integrated circuit including a pair of semiconductor packages. The semiconductor integrated circuit includes a pair of chips provided in the semiconductor packages, respectively. There are provided a plurality of integrated circuits in each of the chips so as to be disposed in a plurality of rows and in a plurality of stages. Each of the integrated circuits sends and receives signals. A plurality of electrode pads are provided on a principal plane of the chip so as to be disposed in a plurality of rows and in a plurality of stages. Each of the electrode pads is connected to the integrated circuits. A plurality of electrode bumps are provided on a surface of each of the semiconductor packages so as to be connected to the electrode pads to form external electrodes for the integrated circuits. One of the pair of semiconductor packages is in a first state in which the electrode bumps are placed on predetermined positions while the other of the pair of semiconductor packages is in a second state in which the electrode bumps are flipped from corresponding positions in the first state. The integrated circuits and the electrode bumps are interconnected differently between the first state and the second state, in such a manner that, when viewing from the principal plane, in a row J and a stage K of the pair of chips are all located identical integrated circuits and that the electrode bumps connected to the integrated circuits located in the row J and the stage K are all located symmetrically with respect to one another.

Other objects and further features of the present invention will be apparent from the following detailed description when read in conjunction with the accompanying drawings.

DESCRIPTION OF THE PREFERRED EMBODIMENTS

Figure 1:
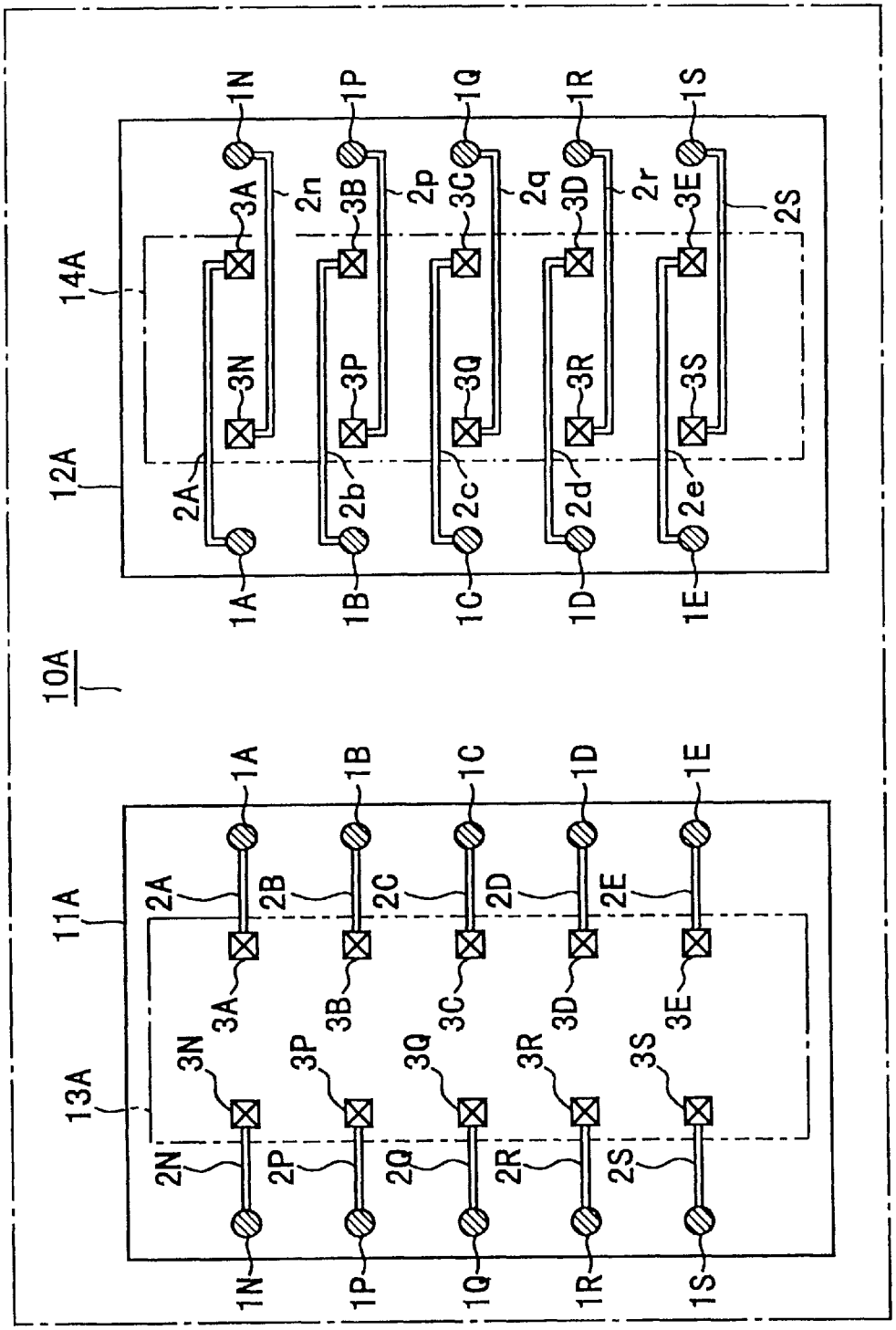
FIGS. 1 through 4 are plane views showing a pair of mirror CSPs each accommodated in a semiconductor package according to a first embodiment of the present invention.
Figure 2:
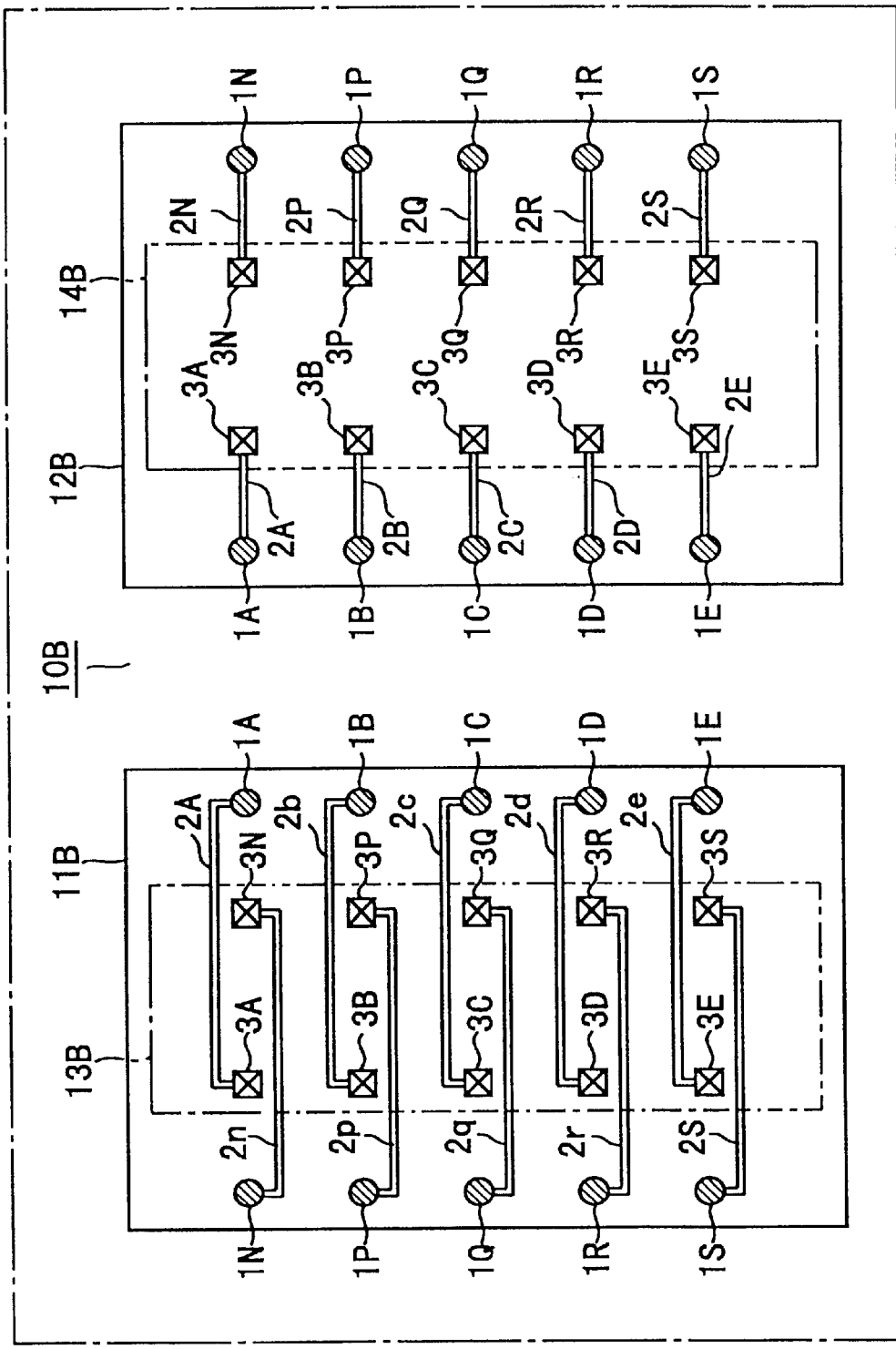
Figure 3:
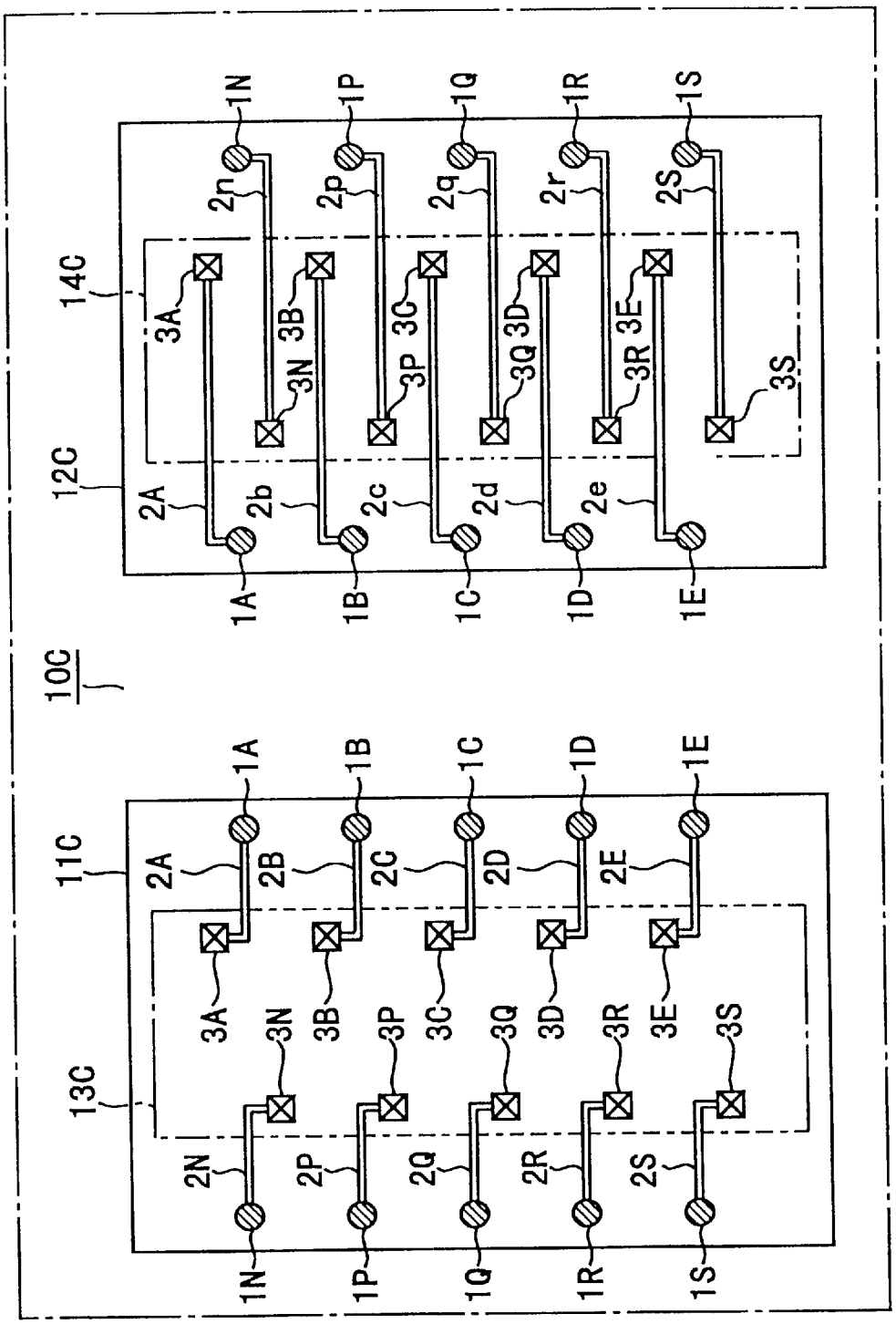
Figure 4:
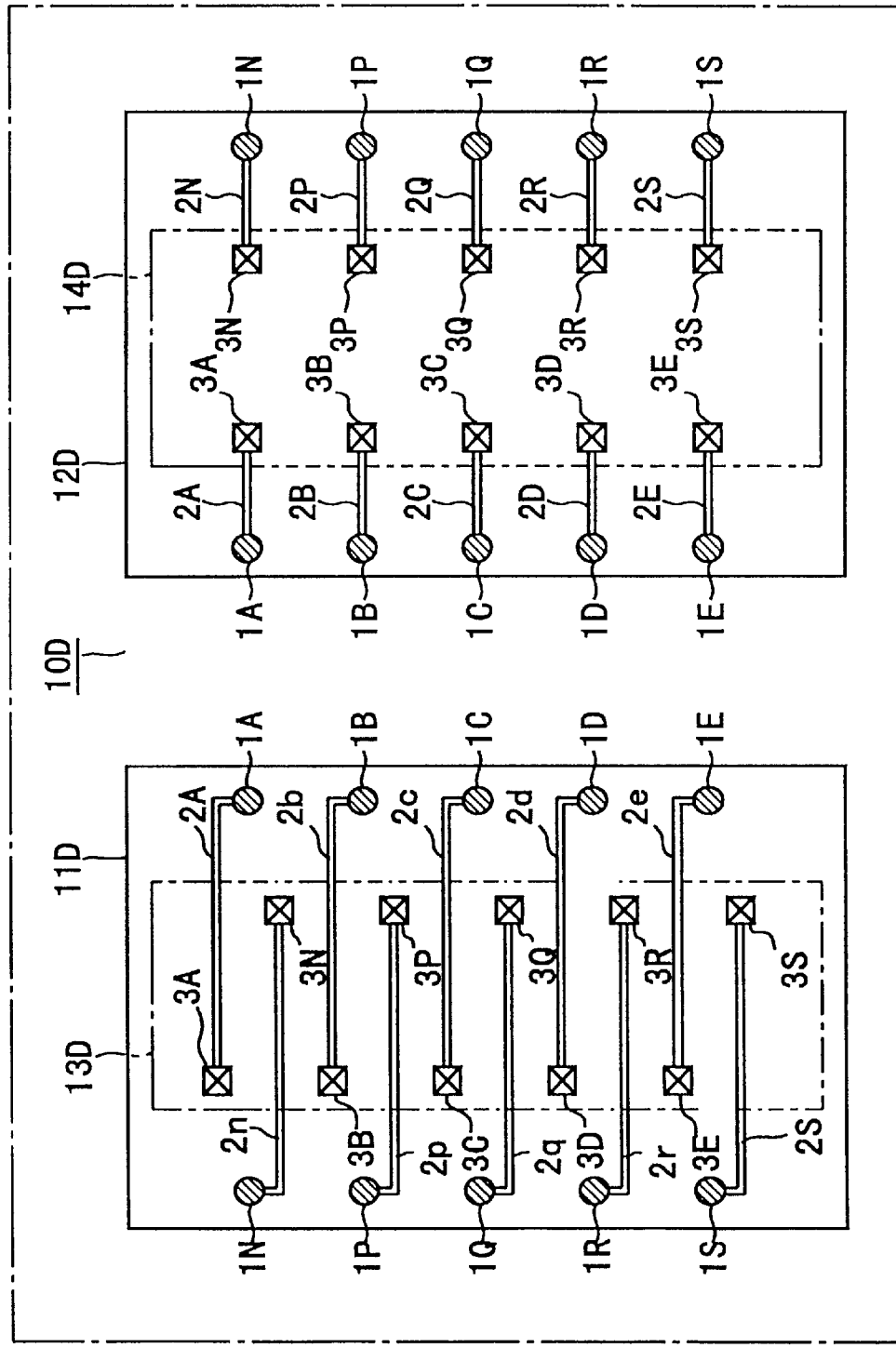
Figure 6:
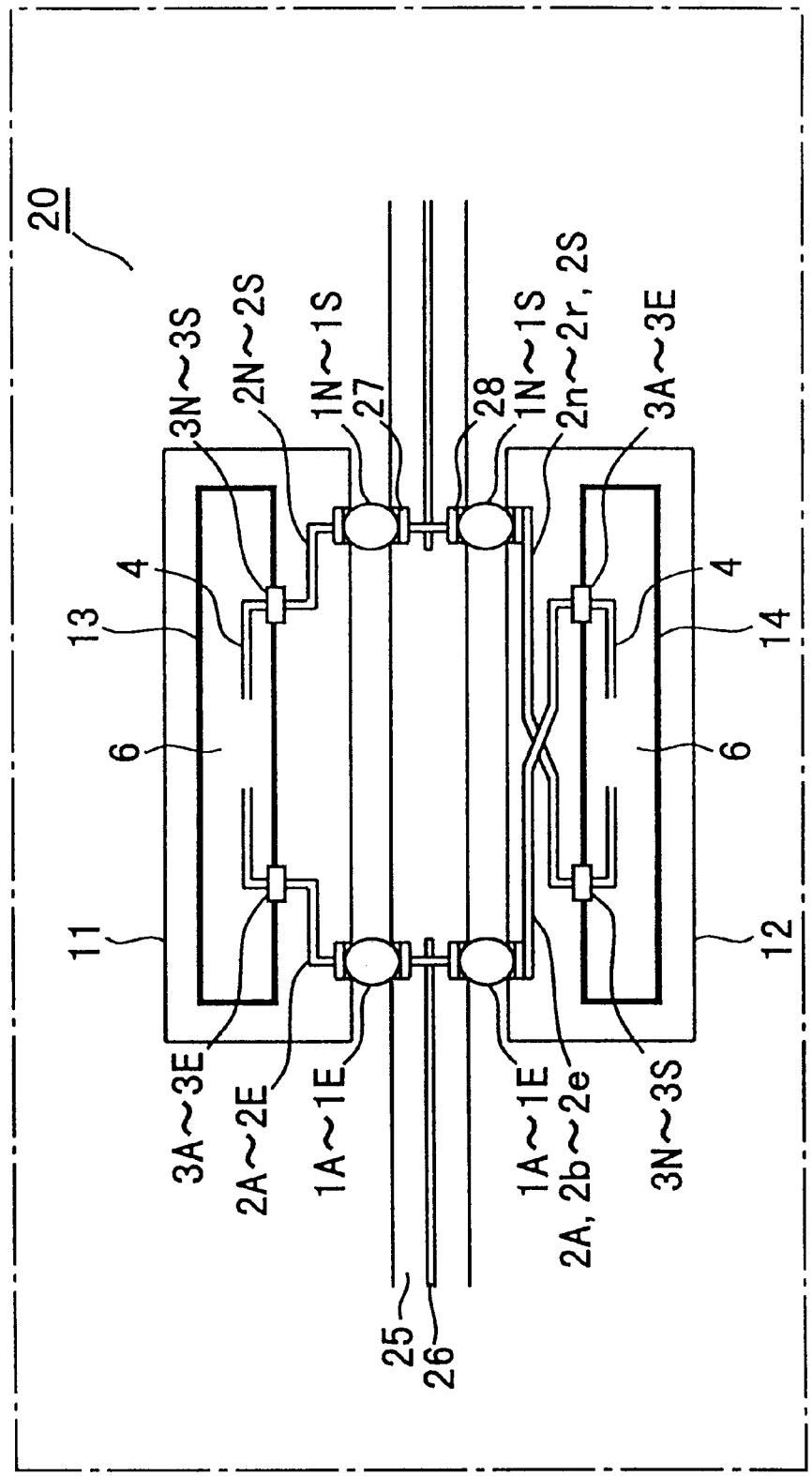
FIG. 6 is a cross-sectional view showing a packaging assembly including the pair of mirror CSPs each accommodated in the semiconductor package according to the first embodiment of the present invention.

Preferred embodiments of this invention will now be described with reference to the accompanying drawings. The drawings are provided schematically to indicate connections and structures of inventive arrangements. Throughout the drawings, like reference characters designate like or corresponding parts.
First Embodiment FIG. 1 is a schematic view showing plane connections of a semiconductor package pair practiced as a first embodiment of the invention. FIG. 6 is a cross-sectional view indicating connections in a packaging assembly comprising the semiconductor package pair of FIG. 1. FIGS. 2, 3 and 4 are plan views of variations derived from the semiconductor package pair in FIG. 1.

First to be described with reference to FIG. 6 is the connective structure of a packaging assembly 20 of a CSP mirror pair made of a front side CSP 11 and a back side CSP 12. In FIG. 6, each CSP is molded illustratively of thin epoxy resin in its entirety except for electrode bumps 1 in two rows (1A through 1E and 1N through 1S) appearing as solder balls typically made of Pb—Sn and projecting from the principal plane.

The front side CSP 11 has its principal plane oriented downward and equipped with the electrode bumps 1. The back side CSP 12 has its principal plane carrying the electrode bumps 1 and facing upward. As illustrated, the two packages sandwich from above and below a memory module substrate 25 composed illustratively of polyimide resin.

The substrate 25 has its internal wiring 26 connected in common to connection terminals 27 on the front side (top) and connection terminals 28 on the back side (bottom). In this structure, the connection terminals 27 and 28 are positioned symmetrically with respect to the substrate.

Shown in FIG. 6 is an example in which the substrate is sandwiched from above and below. Alternatively, the substrate may be sandwiched in many other ways such as from right and left, from front and rear and from front and back.

In FIG. 6, the electrode bumps of the two packages are connected symmetrically to the connection terminals on the front and back sides of the substrate. A row of electrode bumps 1A through 1E on the front side CSP 11 and another row of electrode bumps 1A through 1E on the back side CSP 12 are arranged to face each other from above and below the substrate in such a manner that the bumps come face to face being not alternated between the two sides. A like arrangement is made of another two rows of electrode bumps 1N through 1S from above and below the substrate. Two rows of electrode pads 3 (3A through 3E and 3N through 3S) are arranged to face each other from above and below the substrate in such a manner that the pads are alternated with respect to one another between the two sides. The above arrangements are made possible by installing frame wires 2 made of copper foil for connecting the electrode bumps 1 and electrode pads 3. The frame wires 2 are arranged so as not to coincide with one another in vertical relation on the surfaces or inside of a package substrate illustratively made of epoxy resin.

More specifically, the frame wires 2A through 2S (with upper-case alphabetic reference characters) of the front side CSP 11 differ in vertical relation from frame wires 2b through 2e and 2n through 2r (with lower-case alphabetic reference characters) passing alternately between electrode pads of the back side CSP 12, as will be described later with reference to FIG. 1.

Each electrode pad 3 is connected via a connection wiring layer 4 to an internal circuit 6 made of integrated circuits. The connection wiring layer 4 is constituted illustratively by an aluminum wiring layer formed so as to be exposed on the principal plane of each chip. In a typical semiconductor memory chip, its electrode pads are allocated for the input and output of power supplies, grounding, control signals, address signals, data signals and chip select signals.

In the cross-sectional view of FIG. 6, the front side chip 13 and back side chip 14 with their two rows of electrode pads 3 positioned alternately in vertical relation to one another may be two semiconductor memory chips having an identical function or role. Viewed from above their principal plane, the paired chips may have each of their electrode pads 3 located in the same row and in the same position. The pair of chips may be two finished or half-finished identical semiconductors from the same production lot.

The packaging assembly 20 made of paired CSPs in FIG. 6 is constituted as outlined above. In that constitution, the front side chip 13 and back side chip 14 are allowed to function concurrently. That is, the packaging density of the assembly may be doubled without having to increase its packaging area.

Next to be described with reference to FIG. 1 is a plane connection arrangement of a CSP mirror pair 10A made of a front side CSP 11A and a back side CSP 12A. FIG. 1 shows a CSP structure in which electrode bumps 1, frame wires 2 and electrode pads 3 making up connective elements are formed in two rows and five stages per package. The connective elements are linearly arranged on the plane of each stage.

More specifically, ten electrode bumps formed on the right- and left-hand peripheries of the principal plane of each CSP are arranged at regular intervals in two rows 1A through 1E and 1N through 1S, the rows being symmetrical to each another on the plane. The rows of electrode bumps are also symmetrical in a mirrored fashion between the front side CSP 11A and the back side CSP 12A. Except for the two-row arrangement of the electrode pads 3, the pitch of the electrode bumps in the row direction and their layout positions are the same as those in the conventional example of FIG. 14.

In FIG. 1, the front side chip 13A and the back side chip 14A made of silicon are formed in regions enclosed by dash-dot lines in a rectangular fashion, although the chips are not actually seen because the principal plane of the CSP is covered with a mold layer. As discussed in conjunction with FIG. 6, the front side chip 13A and back side chip 14A may be two identically fabricated semiconductor memory chips.

Five electrode pads 3A through 3E formed in an exposed fashion on the right-hand periphery of the dash-dot line-enclosed chip region are symmetrical to another five electrode pads 3N through 3S formed similarly on the left-hand periphery, on the principal plane of each chip. The electrode pads on the front side CSP 11A are arranged to coincide in positions with their counterparts on the back side CSP 12A.

Figure 14:
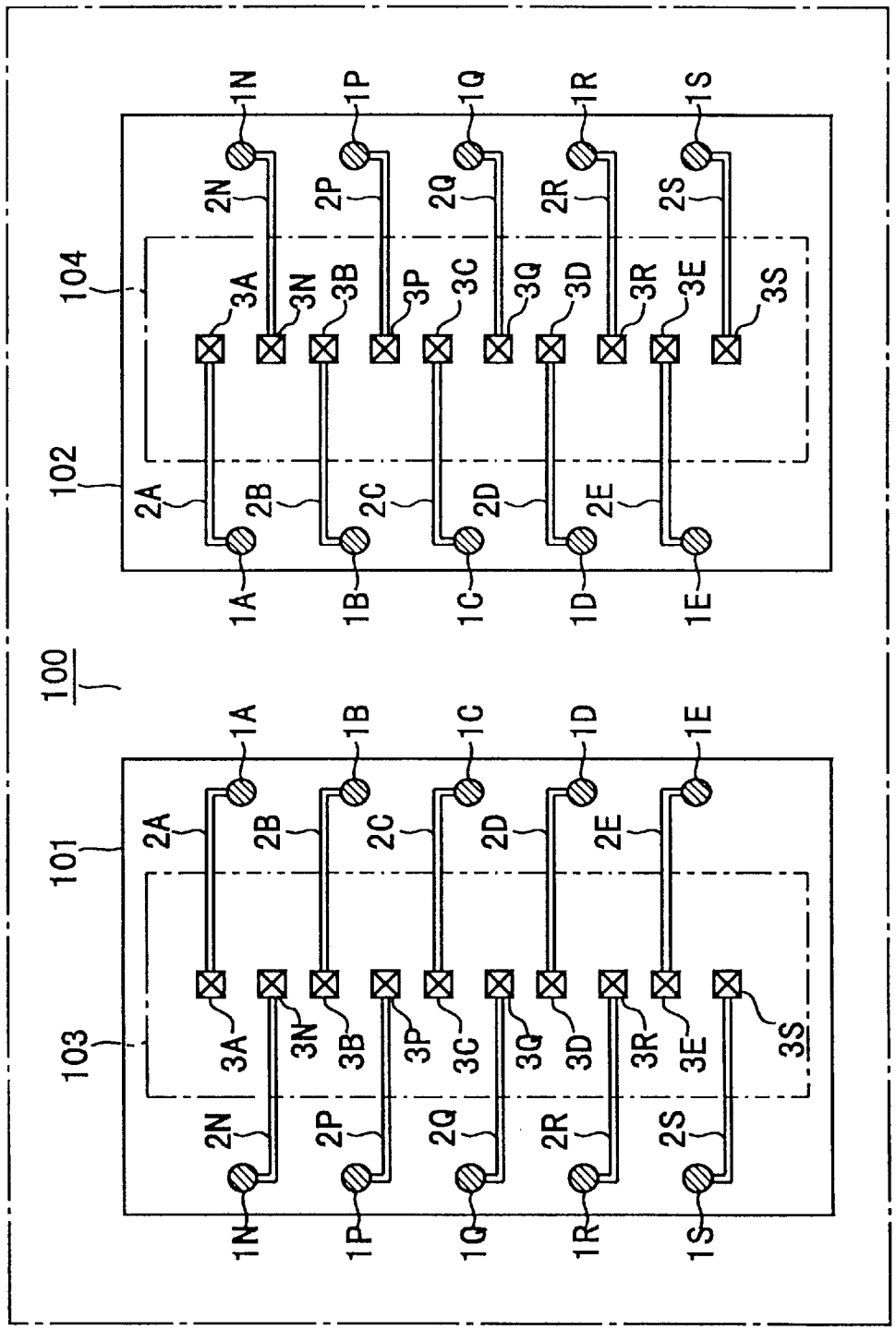
FIG. 14 is a plane view showing a pair of mirror CSPs each accommodated in a conventional semiconductor package.

For purposes of illustration, the ten electrode pads 3A through and 3E and 3N through 3S in FIG. 1 are compared with their counterparts in the conventional example of FIG. 14. The electrode pads 3A through 3E on the right-hand side of the chip region in FIG. 1 are obtained by moving the centrally located electrode pads 3A through 3E of FIG. 14 in the bottom right direction as seen in the figure. The electrode pads 3N through 3S on the left-hand side of the chip region in FIG. 1 are acquired by moving the centrally located electrode pads 3N through 3S of FIG. 14 in the top left direction as viewed in the figure.

In other words, the electrode pad layout in FIG. 1 is formed by apportioning the centrally located single row of electrode pads 3A through 3E and 3N through 3S in FIG. 14 between the right -and left-hand rows of electrode pads 3A through 3E and 3N through 3S in FIG. 1. Because one row has been divided into two rows, the pitch of and the spacing between the electrode pads in the row direction have become at least double those of the conventional example in FIG. 14.

Also in FIG. 1, when the principal plane of the front side CSP 11A is flipped from side to side in the figure, the two rows of electrode bumps 1A through 1E and 1N through 1S swap their arrangements crosswise. The first embodiment is characterized in being constructed so that the rows of electrode pads 3A through 3E and 3N through 3S remain fixed in their crosswise layout under the above mentioned condition.

In other words, flipping the electrode bump rows from side to side reverses the original arrangements but leaves the electrode pads unchanged in their row layout in the first embodiment.

As discussed in conjunction with FIG. 6, the frame wires 2 are furnished inside the packages to connect the electrode bumps 1 and electrode pads 3. Referring to FIG. 1, the frame wires 2A through 2E and 2N through 2S of the front side CSP 11A are apportioned simply right and left on their respective sides when connected. On the back side CSP 12A, one row of frame wires 2A, 2b through 2e and another row of frame wires 2n through 2r, 2S are each apportioned in the opposite direction when connected. Furthermore, on the back side CSP 12A, the frame wires 2b through 2e pass alternately between the frame wires 2n through 2r as well as between the electrode pads on the opposite side.

In the configuration of FIG. 1 where the electrode pads are aligned in two rows, the pitch of and the spacing between the pads in the row direction have become at least double those in the conventional example of FIG. 14. In the conventional configuration of FIG. 14 where the-electrode pads are aligned in a single row in the middle of the CSP, the pitch of the pads is too narrow to let the frame wires be threaded between the electrodes. In the inventive dual electrode pad row arrangement on the CSP peripheries, at least each frame wire from one row may be threaded comfortably between two electrode pads or between two frame wires of the opposite row, given the same CSP size.

The frame wires defined as those "passing alternately between the opposite-side frame wires and/or between the opposite-side electrode pads" are identified by lower-case alphabetic reference characters suffixed to reference numeral 2, as in the case of the frame wires 2b through 2e and 2n through 2r on the back side CSP 12A in FIG. 1. The frame wires not applicable the above definition are identified by upper-case alphabetic reference characters suffixed to reference numeral 2, as in the case of the frame wires 2A through 2S on the same back side CSP 12A in FIG. 1.

Figure 12:
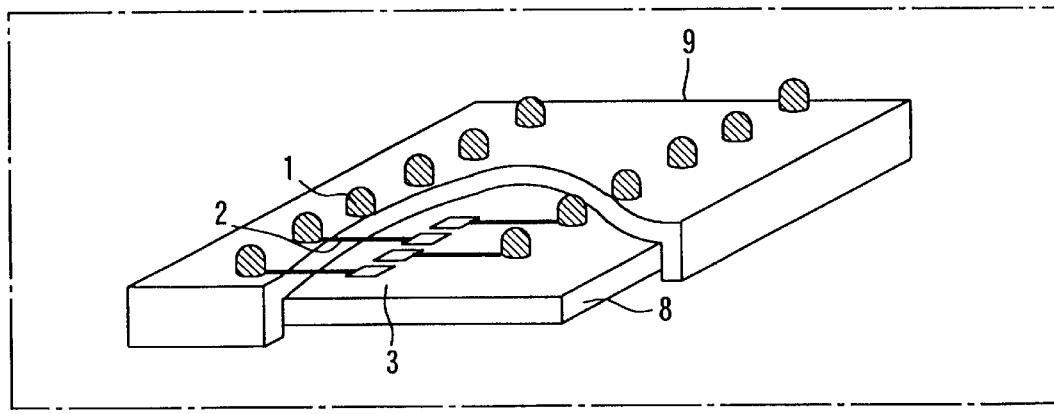
FIG. 12 is a schematic view showing a conventional semiconductor package having CSP structure.
Figure 13:
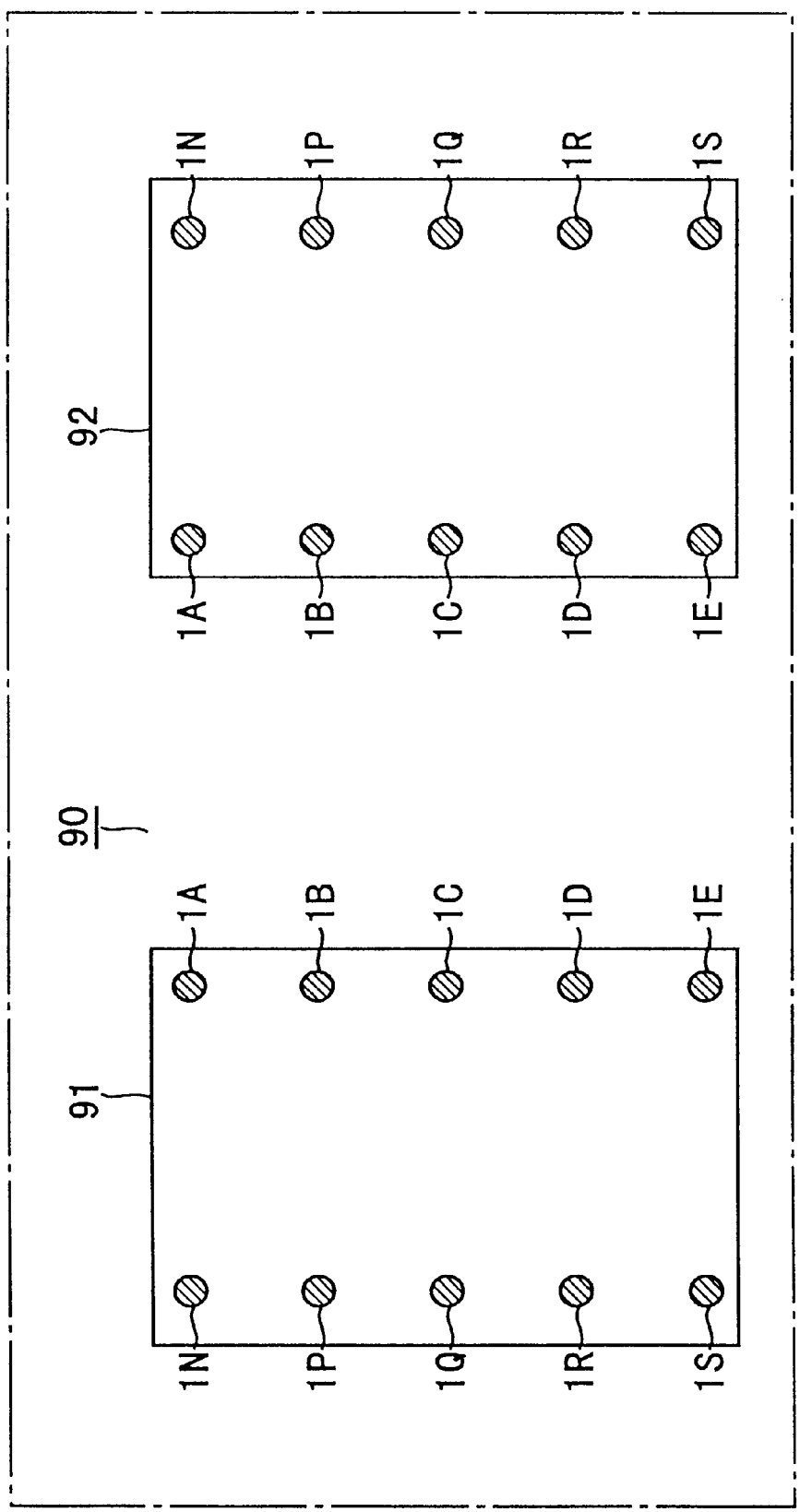
FIG. 13 is a plane view showing primary planes of semiconductor packages having CSP structure.

At first glance, the back side CSP 12A using the chip 14A with the two-row electrode pad arrangement of FIG. 1 presents the same electrode bump layout as that of the CSP in the perspective view of FIG. 12. In fact, the inventive layout differs distinctly from the conventional single-row electrode pad arrangement shown in FIG. 14. That is, in a typical semiconductor memory chip makeup according to the invention, electrode pads and frame wires may at least be doubled in number when mounted on a package having the same memory capacity and the same area as those of the conventional example. This means that by mounting a CSP mirror pair on both sides of a module substrate, it is possible at least to double the packaging density with little increase in packaging area.

Described below with reference to FIGS. 2 through 4 are plane connections of CSP mirror pairs 10B through 10D, i.e., variations derived from the CSP pair 10A. Each of the CSP mirror pairs 10B through 10D is characterized in that one of the front and back side CSPs comprises frame wires "passing alternately between the opposite-side frame wires and/or between the opposite-side electrode pads," identified by lower-case alphabetic reference characters suffixed to reference numeral 2.

The CSP mirror pair 10B is structured as follows: the frame wires 2A, 2b through 2e, 2n through 2r and 2S of the front side CSP 11B in FIG. 2 are obtained by adopting with few changes the frame wires of the back side CSP 12A in FIG. 1. The frame wires 2A through 2S of the back side CSP 12B are acquired by adopting without change the frame wires 2A, 2b through 2e, 2n through 2r and 2S of the front side CSP 11A in FIG. 1.

In other words, the CSP mirror pair 10B is constituted by transferring the connections and the role of the front side CSP in FIG. 1 to the back side CSP of the pair. Thus formed, the CSP mirror pair 10B comprises frame wires "passing alternately between the opposite-side frame wires and/or between the opposite-side electrode pads." It follows that by mounting this type of CSP mirror pair on both sides of a module substrate, it is also possible at least to enhance the packaging density.

Referring to FIG. 3, the CSP mirror pair 10C made of a front side CSP 11C and a back side CSP 12C is characterized in that 10 electrode pads make up two rows in zigzag form, on the principal plane in the right- and left-hand peripheries of each chip region enclosed by dash-dot lines. The zigzag two-row electrode pad arrangement is acquired by simply dividing the conventional 10 centrally aligned single-row electrode pads (in FIG. 14) into two groups, 3A through 3E on the one hand and 3N through 3S on the other hand, and by parallelly translating the respective groups right and left from the middle of the chip region to form two rows.

The back side CSP 12C in FIG. 3 comprises frame wires passing alternately between the opposite-side frame wires and/or between the opposite-side electrode pads.

One advantage of the zigzag electrode pad layout is that it helps improve the imbalance of frame wire lengths on the CSP mirror pair; the frame wires on the front side CSP 11C tend to be longer than those of the front side CSP 11A in FIG. 1, while the frame wires on the back side CSP 12C tend to be shorter than those on the back side CSP 12A in FIG. 1.

Referring to FIG. 4, the CSP mirror pair 10D also has the zigzag electrode pad layout. The frame wires of the front side CSP 11D are obtained by adopting with few changes the frame wires of the back side CSP 12C in FIG. 3 so that the wires pass alternately between the opposite-side frame wires and/or between the opposite-side electrode pads.

In other words, the CSP mirror pair 10D is constituted by transferring the connections and the role of the back side CSP in FIG. 3 to the front side CSP of the pair. Thus formed, the CSP mirror pair 10D has the zigzag two-row electrode pad arrangement. As with the makeup in FIG. 3, the zigzag electrode pad formation helps improve the imbalance of frame wire lengths on the CSP mirror pair.

The CSP mirror pair structure having the zigzag electrode pad arrangement shown in FIGS. 3 and 4 provides a better improvement in the imbalance of frame wire lengths on the CSP mirror pair than the CSP mirror pair structure in which the electrode bumps, frame wires and electrode pads making up connective elements in rows and stages are linearly arranged on the plane of each stage.

Other variations of the first embodiment above are explained below.
(A) In the configurations above, the paired CSPs sandwiching the substrate from above and below have been shown arranged so that their electrode bumps on their principal planes are all interconnected between the two sides of the substrate. However, this is not limitative of the invention. Alternatively, only part of the electrode bumps may be interconnected, or the CSP mirror pair may be otherwise arranged in connection when mounted on the substrate.
(B) Although the electrode bumps have been shown formed in two rows and five stages on the principal plane of each CSP, this is not limitative of the invention. Any other number of rows and stages may be adopted so that larger numbers of electrodes may be furnished.
(C) The frame wires have been shown mounted on the surfaces or inside of the epoxy resin package substrate. Alternatively, the frame wires may be installed in a resin mold.

The major features of the first embodiment implemented as a semiconductor package pair and a packaging assembly made of such a package pair are recapitulated below.
(1) A CSP mirror pair having two rows of electrode bumps and sandwiching a substrate from above and below is provided using two chips that comprise electrode pads offering the same functions or the same role in the same rows and positions on their principal planes.
(2) When the principal plane of the front side CSP is turned over so as to flip the electrode bumps thereon, two rows of electrode bumps swap their arrangements crosswise. On the other hand, two rows of electrode pads remain fixed in their crosswise layout.
(3) On the principal plane of each chip on the front or back side CSP, two rows of electrode pads are positioned in a symmetrically alternated manner, not coinciding in the opposite pad positions.
(4) In conjunction with the features (1) through (3) above, a row of electrode bumps on each of the front and back side CSPs and another row of electrode bumps on each of the front back side CSPs are arranged to face each other from above and below the substrate in such a manner that the bumps come face to face and are not alternated between the two sides. Two rows of electrode pads are arranged to oppose each other from above and below the substrate in such a manner that the pads are alternated with respect to one another between the two sides. These arrangements are made possible by use of connection wiring means practiced as the frame wires for connecting the electrode bumps and electrode pads within the package outside the chip, the frame wires being opposed to one another between the front and back side CSPs in their different wired positions.
(5) On the principal plane of each chip of the front or back side CSP, one row of frame wires is symmetrically opposed to the other row of frame wires in layout.
(6) At least one of the two rows of frame wires comprises the wires passing alternately between the opposite-side contiguous frame wires and/or between the opposite-side contiguous electrode pads.
(7) One of two layout patterns linear or zigzag is adopted in arranging connective elements in rows and stages. In the linear layout pattern, electrode bumps, frame wires and electrode pads making up the connective elements are linearly furnished on the plane. In the zigzag layout pattern, the electrode pads are arranged in zigzag form.
(8) In a typical semiconductor memory chip makeup according to the invention, electrode pads and frame wires may at least be doubled in number when mounted on a package having the same memory capacity and the same area as those of the conventional example. This means that by mounting a CSP mirror pair on both sides of a module substrate, it is possible at least to double the packaging density with little increase in packaging area.

Second Embodiment

Figure 5:
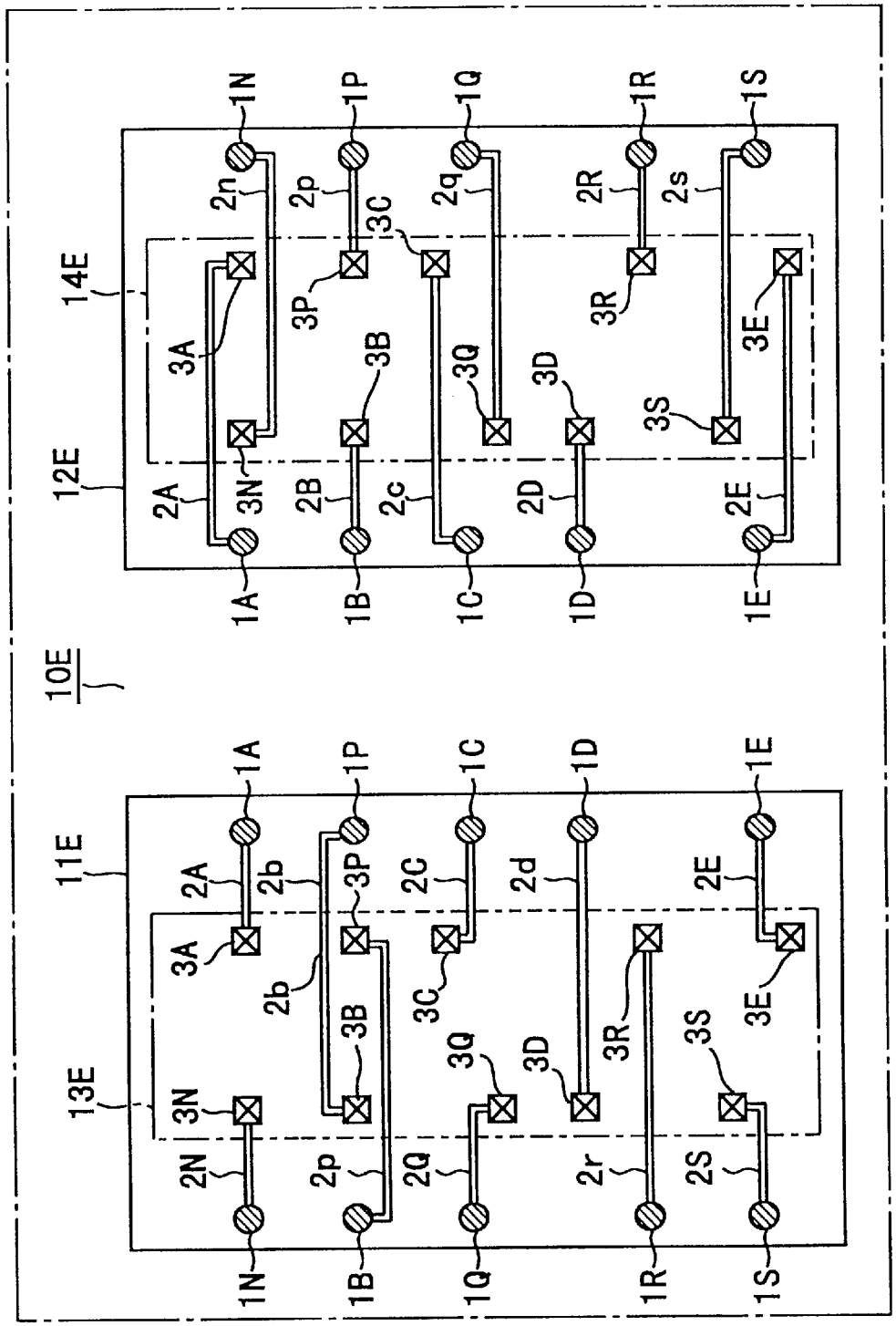
FIGS. 5 and 7 are plane views showing a pair of mirror CSPs each accommodated in a semiconductor package according to a second embodiment of the present invention.
Figure 7:
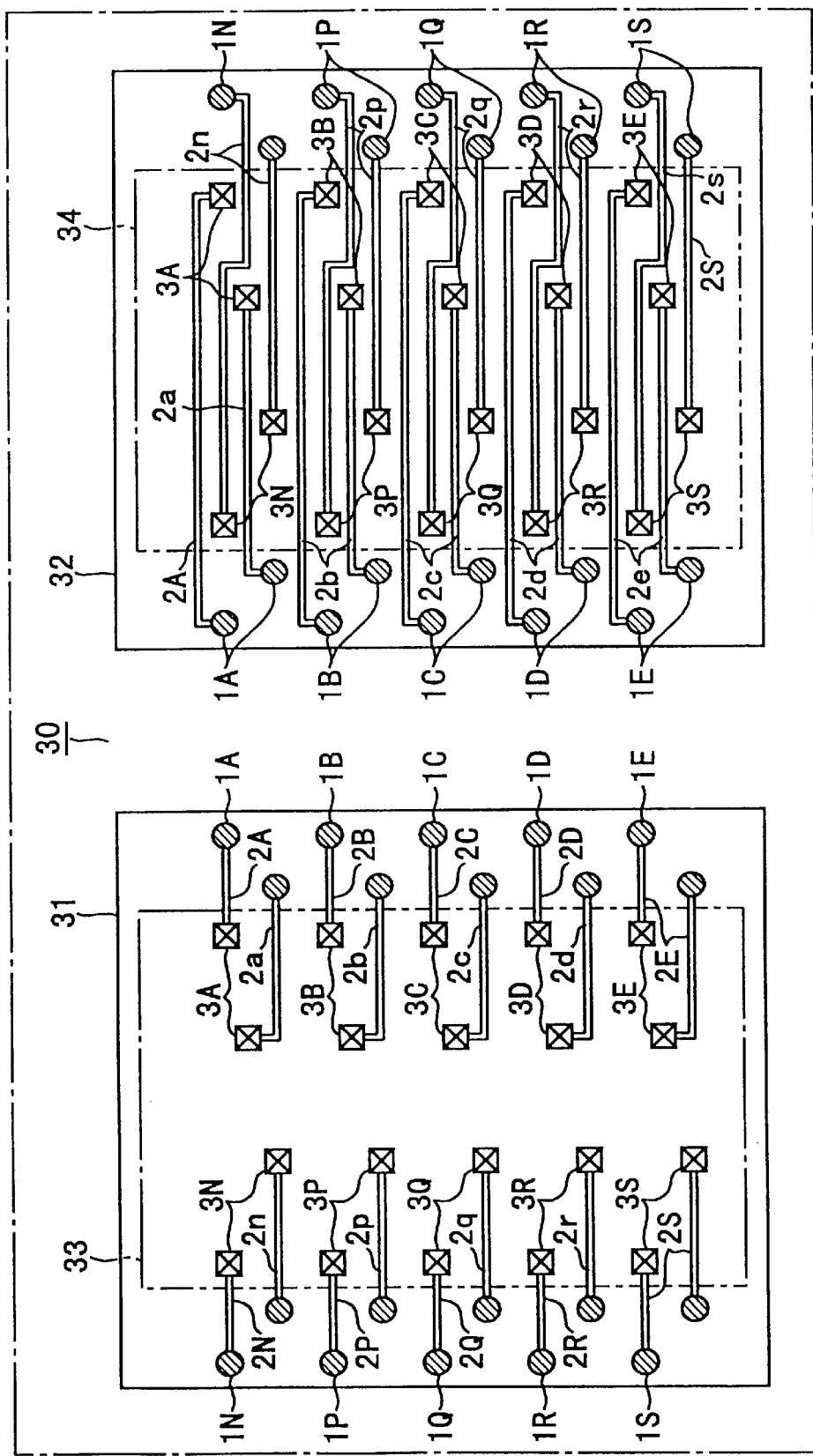

FIGS. 5 and 7 are schematic views showing plane connections of a semiconductor package pair practiced as a second embodiment of the invention. A view showing cross-sectional connections of a packaging assembly using the CSP mirror pair of FIG. 5 or 7 is omitted. Instead, FIG. 6 is used as a substitute for such a view. In FIGS. 5 and 7, like reference numerals designate like or corresponding parts included in FIGS. 1 through 4, and descriptions of such parts are omitted below where they are repetitive.

In FIG. 5, a CSP mirror pair 10E with a two-row, five-stage layout is constituted by combining the linear layout pattern of plane connections in FIGS. 1 and 2 with the zigzag layout pattern of FIGS. 3 and 4, in mixed fashion in the row direction. The layout in FIG. 5 is called a linear zigzag series layout arrangement.

More specifically, the electrode bumps 1N, frame wire 2N, electrode pads 3N and 3A, frame wire 2A, and electrode bump 1A constituting the connective elements in a first stage of a front side CSP 11E are laid out in the same manner as their counterparts in the first stage of the corresponding package in FIG. 1. Likewise, the connective elements in a first stage of a back side CSP 12E are laid out in the same manner as their counterparts in the first stage of the corresponding package in FIG. 1.

The connective elements in the second stage of each of the front and back side CSPs 11E and 12E are laid out in the same manner as their counterparts in the second stage of the configuration in FIG. 2. Similarly, the connective elements in the third stage of each of the front and back side CSPs are laid out in the same manner as their counterparts in the third stage of the configuration in FIG. 3. Furthermore, the connective elements in the fourth stage of each of the front and back side CSPs are laid out in the same manner as their counterparts in the fourth stage of the configuration in FIG. 4.

When the connective elements in two rows and five stages re laid out in the linear zigzag series layout arrangement as shown in FIG. 5, frame wires $2b$, $2d$, $2p$ and $2r$ are provided on the front side CSP 11E, and frame wires $2c$, $2n$, $2q$ and $2s$ are installed on the back side CSP 12E.

In other words, the CSP mirror pair 10E is characterized in that the frame wires 2 passing alternately between the opposite-side contiguous frame wires and/or between the opposite-side contiguous electrode pads (and identified by lower-case alphabetic reference characters suffixed to reference numeral 2) are included in both the front and the back side CSPs 11E and 12E.

As a result, the CSP mirror pair 10E in FIG. 5 provides a better improvement in the imbalance of frame wire lengths on the CSP mirror pair than the CSP mirror pair structure of FIG. 3 or 4 that is composed solely of the zigzag arrangement involving the above-described two-row, five-stage layout.

Referring to FIG. 7, a CSP mirror pair 30 with a four-row, five-stage layout pattern has what may be called a linear zigzag parallel layout arrangement. The arrangement includes two patterns furnished in parallel with each other in the row direction: a two-row, five-stage "linear layout pattern" in the peripheries of the principal plane of each CSP; and a two-row, five-stage "zigzag layout pattern" located toward the inside.

The CSP mirror pair 30 thus has its connective elements laid out in four rows and five stages, wherein the two-row five-stage linear layout pattern parallels the two-row five-stage zigzag layout pattern. In this configuration, frame wires $2a$ through $2d$ and $2n$ through $2r$ are provided on the front side CSP 31, while frame wires $2a$ through $2e$ and $2n$ through $2s$ are installed on the back side CSP 32.

In other words, the CSP mirror pair 30 is characterized in that the frame wires 2 passing alternately between the opposite-side contiguous frame wires and/or between the opposite-side contiguous electrode pads (and identified by lower-case alphabetic reference characters suffixed to reference numeral 2) are always included in both the front and the back side CSPs 31 and 32 as well as in all stages of the two packages.

As a result, the CSP mirror pair 30 in FIG. 7 having the linear zigzag parallel layout arrangement provides a far better improvement in the imbalance of frame wire lengths on the CSP mirror pair than the CSP mirror pair structure of FIG. 5 that is composed of the linear zigzag series layout arrangement.

FIG. 6 may be referenced as a substitute for a cross-sectional view of connections in a packaging assembly using the CSP mirror pair of FIG. 5 or 7. For that purpose, the frame wires 2A through 2S in the existing front side CSP of FIG. 6 should be read as including frame wires $2b$ through $2e$ and $2n$ through $2r$. That is, FIG. 6 may be regarded as a cross-sectional view supplemented by the same dual wiring arrangement as the frame wiring in the existing back side CSP.

Variations of the second embodiment will now be described.

(A) The layout pattern is not limited to the linear zigzag series layout arrangement and linear zigzag parallel layout arrangement only. Alternatively, the second embodiment may be implemented using either the linear layout or the zigzag layout alone.

(B) Although the second embodiment has been shown adopting the two-row five-stage layout as well as the four-row five-stage layout, this is not limitative of the invention. The number of rows is not limited to an even number. The electrode bumps are not limited in their positions to the peripheries of the principal plane of the package. That is, electrode bumps may be provided in an odd number of rows, and an odd-numbered row of electrode bumps may be installed at the center or in the middle of the principal plane of the package. The electrode bumps may be arranged in a square pattern or a square-minus-one-side pattern at the peripheries of the principal plane of the package.

(C) It is possible to equip all stages of the front and back side CSPs with frame wires passing alternately between the opposite-side contiguous frame wires and/or between the opposite-side contiguous electrode pads. In other words, the invention may be applied to a BGA (Ball Grid Array) structure CSP wherein electrode bumps are furnished substantially over the entire principal plane of the package.

(D) Where CSP/BGA structure packages are to be provided with frame wires passing alternately between the opposite-side contiguous frame wires and/or between the opposite-side contiguous electrode pads in a multiple-row multiple-stage makeup, the number of rows should preferably not exceed the number of stages.

It is the layout pattern that characterizes the second embodiment implemented as a CSP mirror pair of semiconductor packages and as a packaging assembly comprising such packages. The major features of the second embodiment are recapitulated below.

(1) The connective elements in the linear and/or zigzag layout pattern are arranged either serially or in parallel in the row direction, i.e., in the linear zigzag series layout arrangement or the linear zigzag parallel layout arrangement.

(2) It is possible to furnish both the front and the back side CSPs with frame wires passing alternately between the opposite-side contiguous frame wires and/or between the opposite-side contiguous electrode pads. It is also possible to provide all stages of the front and back side CSPs with such frame wires.

(3) The connective elements of the CSP mirror pair may be arranged in an odd or an even number of rows in a plurality of stages. The CSP electrode bumps may be formed in the BGA structure.

(4) The features above combine to provide a further improvement in the imbalance of frame wire lengths on the CSP mirror pair, whereby signal transmission delays may be smoothed out.

Third Embodiment

Figure 8:
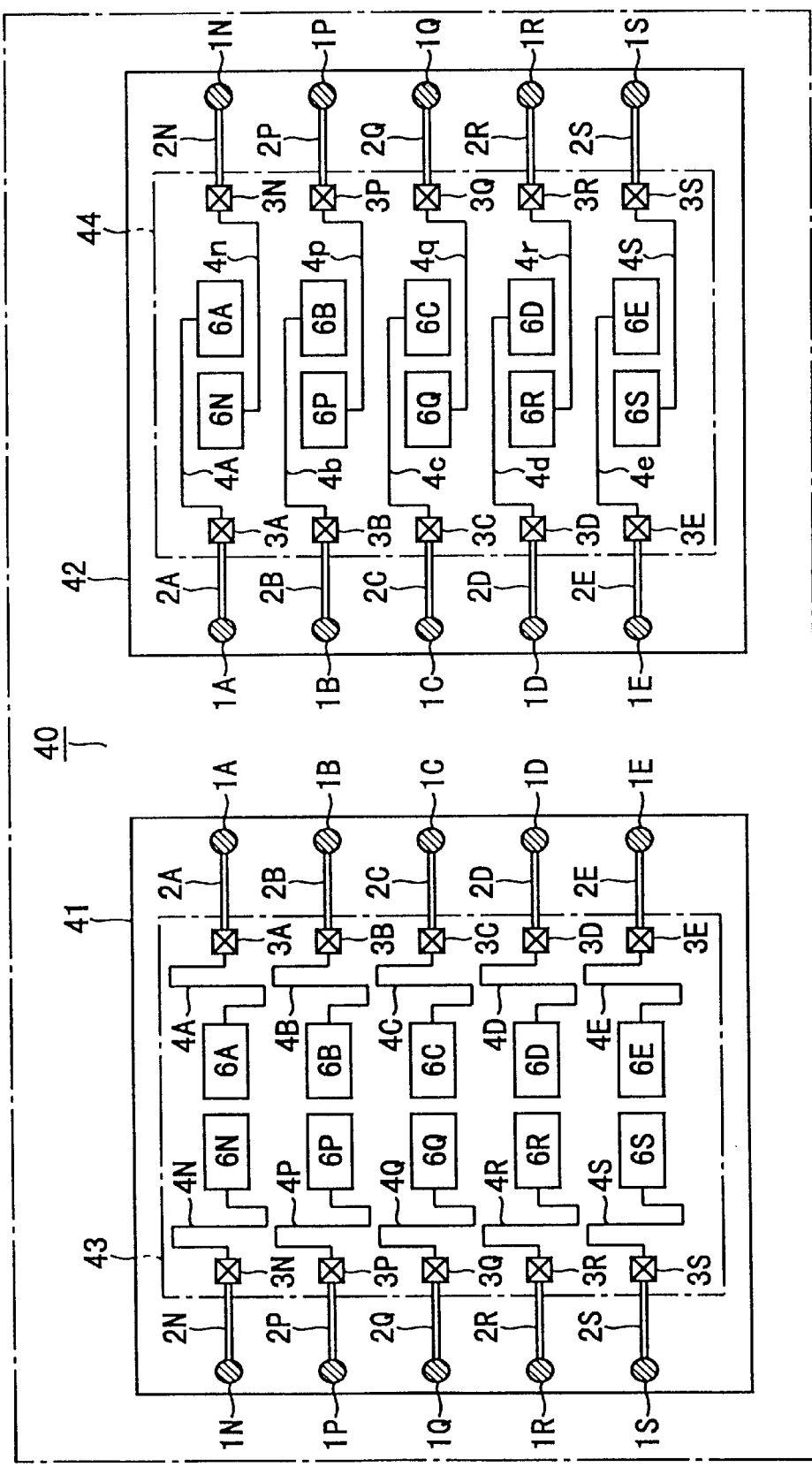
FIG. 8 is a plane view showing a pair of mirror CSPs each accommodated in a semiconductor package according to a third embodiment of the present invention.
Figure 9:
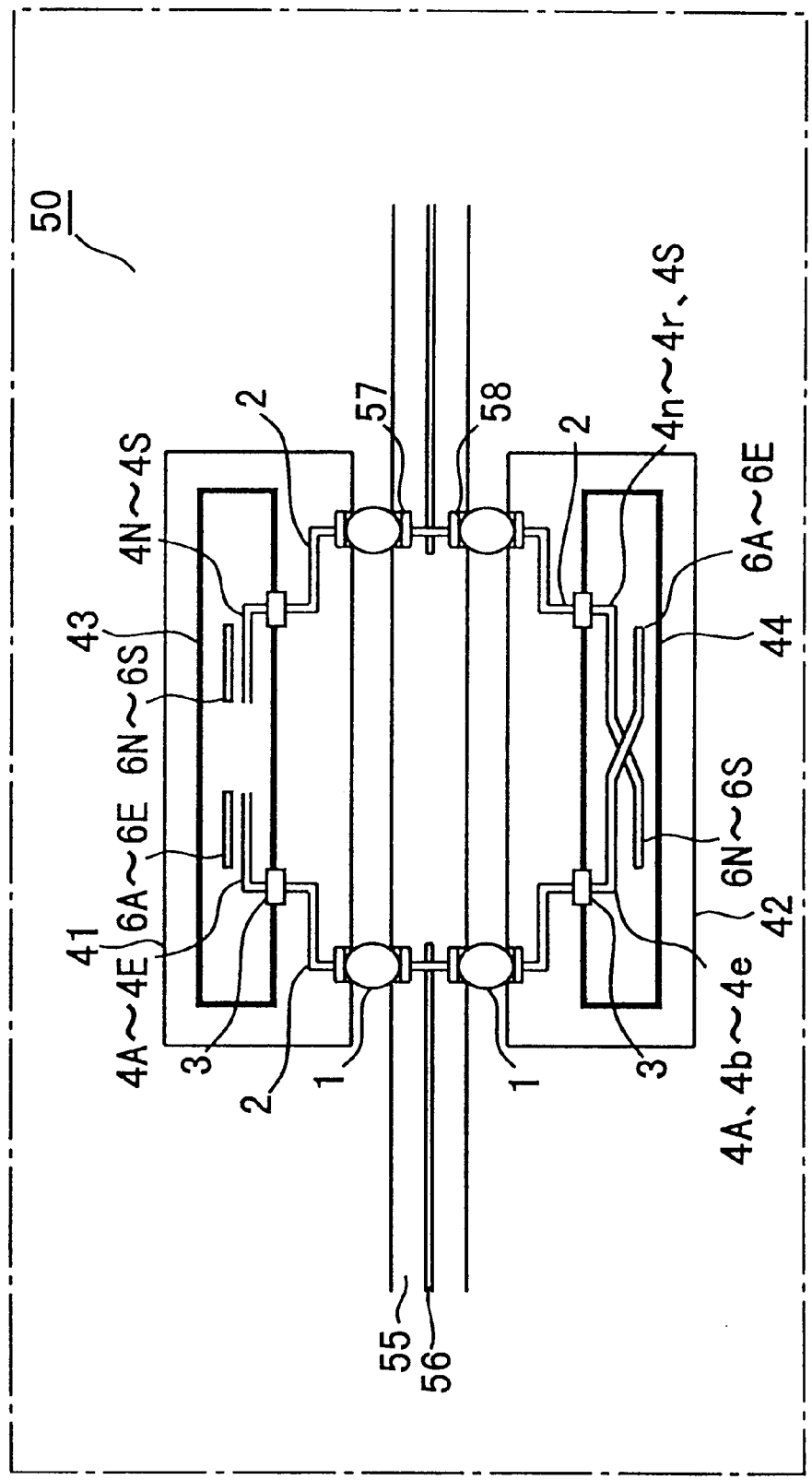
FIG. 9 is a cross-sectional view showing a packaging assembly including the pair of mirror CSPs each accommodated in the semiconductor package according to the third embodiment of the present invention.

FIG. 8 is a schematic view showing plane connections of a semiconductor package pair practiced as a third embodiment of this invention. FIG. 9 is a schematic view depicting cross-sectional connections of a packaging assembly comprising the semiconductor package pair of FIG. 8. In FIGS. 8 and 9, like reference numerals designate like or corresponding parts included in FIGS. 1 through 5, 6 and 7, and descriptions of such parts are omitted below where they are repetitive.

Referring to FIG. 8, a CSP mirror pair 40 including CSPs in two rows and five stages is constituted by supplementing the configurations in FIGS. 1 through 7 with a connection wiring layer (4A through 4S, 4b through 4e, 4n through 4r), i.e., new connection wiring means inside the chip, together with internal circuits (6A through 6S).

In FIG. 8, the internal circuits 6A through 6S inside a typical semiconductor memory chip are made up of integrated circuits for the input and output of power supplies, grounding, control signals, address signals, data signals and chip select signals. The connection wiring layer 4A through 4S, 4b through 4e, and 4n through 4r connected to the internal circuits 6A through 6S inside the chip is illustratively composed of an aluminum wiring layer. The connection wiring layer is formed so as to minimize wiring distances between the internal circuits for sending and receiving signals on the one hand, and electrode pads on the other hand, and is connected to electrode pads 3A through 3N via exposed openings on the principal plane of the chip. Serving as connection wiring means, the aluminum connection layer should preferably be furnished as a top layer in ordinary multiple wiring layers of the chip in order to minimize signal transmission delays between the internal circuits and the electrode pads.

The cross-sectional connections as means for constituting a new CSP mirror pair in FIG. 8 are described below with reference to FIG. 9. In FIG. 9, a row of a connection wiring layer (4A through 4E) on a front side CSP 41 is opposed vertically to a row of a connection wiring layer (4A, 4b through 4e) on a back side CSP 42. Similarly, a row of a connection wiring layer (4N through 4S) on the front side CSP 41 is opposed vertically to a row of a connection wiring layer (4n through 4r, 4S) on the back side CSP 42.

In addition, a row of internal circuits (6A through 6E) on the front side CSP 41 is opposed vertically to a row of internal circuits (6N through 6S) on the back side CSP 42. Likewise, a row of an internal circuits (6N through 6S) on the front side CSP 41 is opposed vertically to a row of internal circuits (6A through 6E) on the back side CSP 42.

In the configuration of FIG. 9 where the rows of connection wiring layers (4A through 4E; 4A, 4b through 4e) are vertically opposed and where the rows of connection wiring layers (4N through 4S; 4n through 4r, 4S) are positioned likewise, two rows of internal circuits (6A through 6E; 6N through 6S) are opposed in a vertically staggered fashion. The two rows of internal circuits (6A through 6E; 6N through 6S) are connected to the corresponding rows of electrode pads 3 that are opposed in a manner not vertically staggered, each internal circuit being connected to the corresponding electrode pad in the coinciding position. Two chips each comprising two rows of electrode pads are placed in packages each having two rows of electrode bumps 1. A substrate is sandwiched from above and below by these packages constituting a CSP mirror pair.

Returning to FIG. 8, two rows of connection wiring layers 4A through 4E and 4N through 4S on the front side CSP 41 are apportioned simply right and left on their respective sides when connected, in such a manner that wiring distances on both sides are made substantially the same. On the back side CSP 42, the connection wiring layer (4A, 4b through 4e) in one row and the connection wiring layer (4n through 4r, 4S) in another row are each apportioned in the opposite direction when connected, in such a manner that wiring distances on both sides are made substantially the same. Furthermore, whether the rows of the connection wiring layers are apportioned simply right and left on the front side CSP 41 or each in the opposite direction on the back side CSP 42, the wiring distances of both packages are made substantially the same. Because the connection wiring layer of each chip is formed as a top layer in a multiple-wiring layer makeup, it is easy to match not only the wiring distances but also impedance levels. However, once their connection wiring layers 4 are formed, the front and back side chips must be managed separately.

In FIG. 8, the connection wiring layers (4b through 4e; 4n through 4r) of the back side CSP 42 are formed in such a manner that the individual wires pass alternately between the opposite-side contiguous wires as well as between the opposite-side contiguous internal circuits 6. The second embodiment is characterized in that it is easy to form the structure in which the wires pass alternately between the opposite-side contiguous internal circuits 6, as well as the structure is included in one of the front and back side CSPs 41 and 42.

A state in which the electrode bumps on the principal plane of the CSP have yet to be flipped is called the first state (applicable to the front side CSP), and a state in which the electrode bumps are flipped by turning over the principal plane of the CSP in the first state is called the second state (in effect for the back side CSP). With the two CSPs in the first and the second state, the two-row five-stage layout pattern of FIG. 8 is formed as follows: specifically, in the first row from left and the first stage from top, two internal circuits 6N coincide in the same position; two electrode pads 3N are positioned in a symmetrically opposite manner; and two electrode bumps 1N are also located in symmetrically opposite relation to each other.

When such differently arranged connection wiring layers are used by the front and back side CSPs, the CSP pair may have a layout pattern in which only the internal circuits 6N for signal input and output remain unchanged in their positions whether the electrode bumps are flipped or not flipped.

Fourth Embodiment

Figure 10:
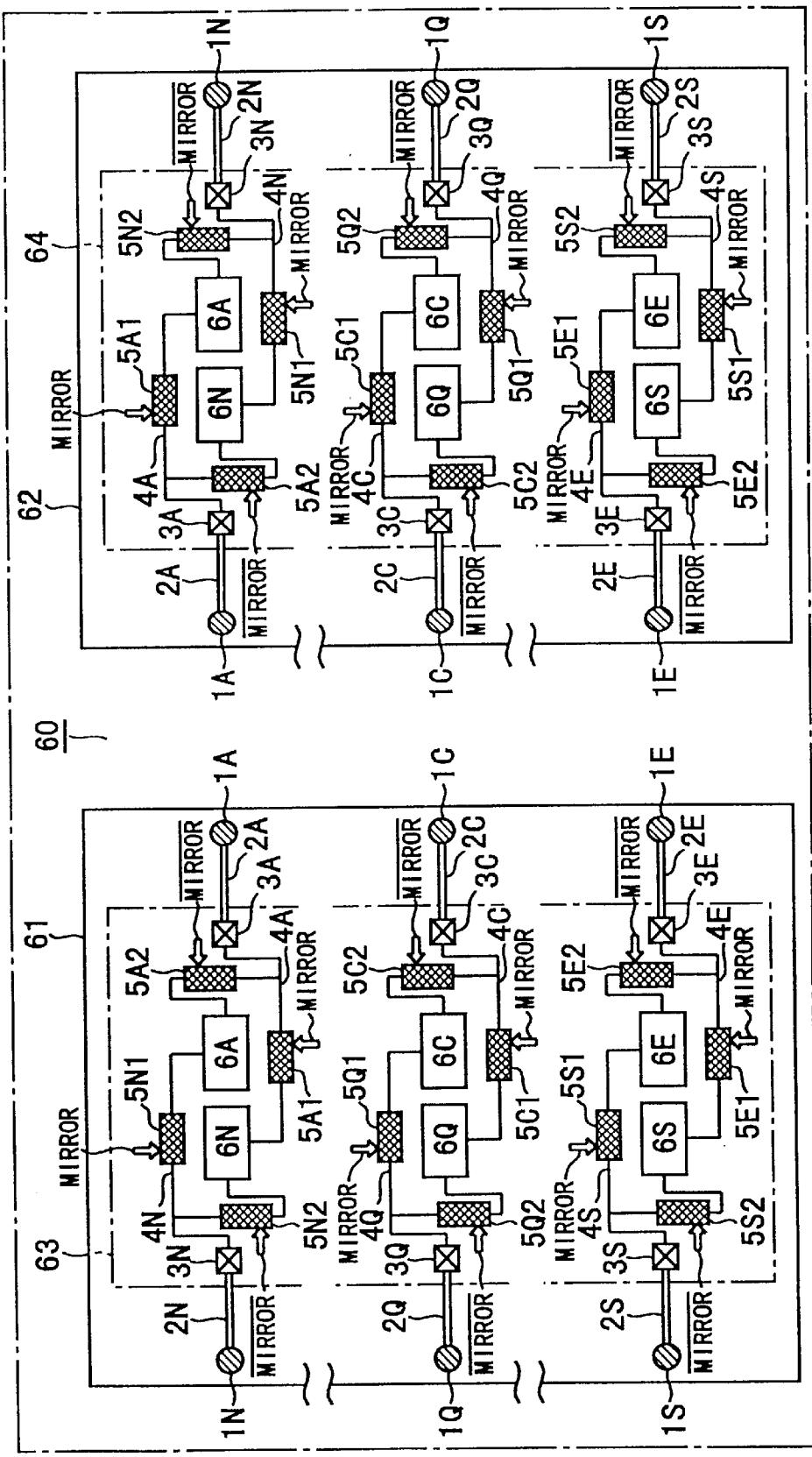
FIG. 10 is a plane view showing a pair of mirror CSPs each accommodated in a semiconductor package according to a fourth embodiment of the present invention.
Figure 11:
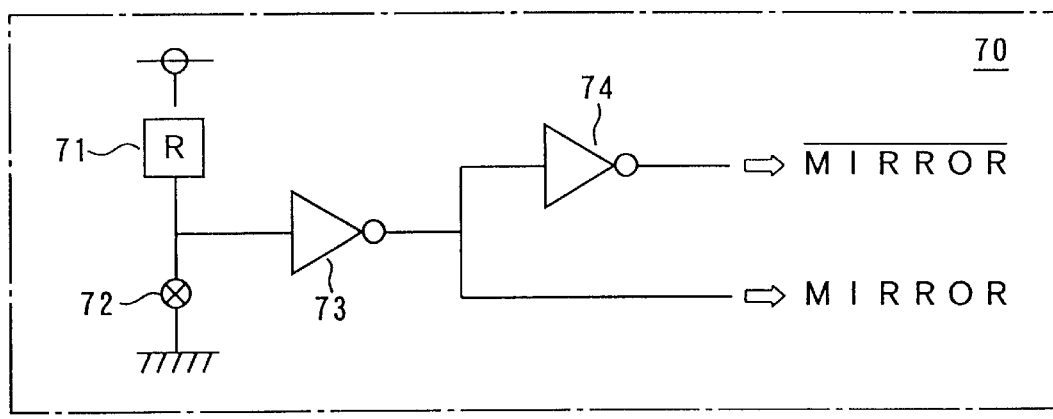
FIG. 11 is a circuit diagram of a paired signal generating circuit included in the CSP accommodated in the semiconductor package according to the fourth embodiment of the present invention.

FIG. 10 is a schematic view showing plane connections of a semiconductor package pair practiced as a fourth embodiment of this invention. FIG. 11 is a circuit diagram of a paired signal mirror generating circuit for controlling a mirror switch included in connection wiring layers of the semiconductor package pair in FIG. 10. In FIGS. 10 and 11, like reference numerals designate like or corresponding parts included in FIG. 8, and descriptions of such parts are omitted below where they are repetitive.

Referring to FIG. 10, a CSP mirror pair 60 of two rows and five stages is constituted by supplementing the connection wiring layer (connection wiring means) in FIG. 9 with mirror switches (5A1 through 5N1) and reverse mirror switches (5A2 through 5N2). For purposes of simplification, FIG. 10 shows only two rows and three stages (A, C, E; N, Q, S) out of the two rows and five stages involved.

In a CSP 61 shown in FIG. 10, the mirror switches (5A1 through 5S1) are each turned on when a logic signal MIRROR is brought High by a mirror signal. When thus turned on, the mirror switch 5N1 illustratively completes an electrical path connecting, from the left looking in FIG. 10, an electrode bump 1N, a frame wire 2N, an electrode pad 3N, the mirror switch 5N1, and an internal circuit 6A in that order; from the right looking in FIG. 10, the mirror switch 5A1 completes an electrical path connecting an electrode bump 1A, a frame wire 2A, an electrode pad 3A, the mirror switch 5A1, and an internal circuit 6N in that order. The electrical paths thus connected are the same as their counterparts in the back side CSP 42 of FIG. 8.

In a CSP 62 shown in FIG. 10, the mirror switches (5A1 through 5S1) are each turned on when the logic signal MIRROR is brought High by the mirror signal. When thus turned on, the mirror switch 5N1 illustratively completes an electrical path connecting, from the right looking in FIG. 10, the electrode bump 1N, frame wire 2N, electrode pad 3N, the mirror switch SN1, and internal circuit 6N in that order; from the left looking in FIG. 10, the mirror switch 5A1 completes an electrical path connecting the electrode bump 1A, frame wire 2A, electrode pad 3A, the mirror switch 5A1, and internal circuit 6A in that order. The electrical paths thus connected are the same as their counterparts in the back side CSP 42 of FIG. 8.

That is, driving the logic signal MIRROR High turns on the mirror switches 5A1 through 5S1 which in turn complete all their electrical paths, whereby a mirror circuit connection state is provided (for the back side chip). Conversely, bringing the logic signal MIRROR Low turns off the mirror switches 5A1 through 5S1 which in turn break all their electrical paths.

In the CSP 61 of FIG. 10, the reverse mirror switches (5A2 through 5S2) are each turned on when a reverse logic signal /MIRROR is brought High by a reverse mirror signal. When thus turned on, the reverse mirror switch 5N2 illustratively completes an electrical path connecting, from the left looking in FIG. 10, the electrode bump 1N, frame wire 2N, electrode pad 3N, reverse mirror switch 5N2, and internal circuit 6N in that order; from the right looking in FIG. 10, the reverse mirror switch 5A2 completes an electrical path connecting the electrode bump 1A, frame wire 2A, electrode pad 3A, reverse mirror switch 5A2, and internal circuit 6A in that order. The electrical paths thus connected are the same as their counterparts in the front side CSP 41 of FIG. 8.

In the CSP 62 of FIG. 10, the reverse mirror switches (5A2 through 5S2) are each turned on when the reverse logic signal /MIRROR is brought High by the reverse mirror signal. When thus turned on, the reverse mirror switch 5N2 illustratively completes an electrical path connecting, from the right looking in FIG. 10, the electrode bump 1N, frame wire 2N, electrode pad 3N, reverse mirror switch 5N2, and internal circuit 6A in that order; from the left looking in FIG. 10, the reverse mirror switch 5A2 completes an electrical path connecting the electrode bump 1A, frame wire 2A, electrode pad 3A, reverse mirror switch 5A2, and internal circuit 6N in that order. The electrical paths thus connected are the same as their counterparts in the front side CSP 41 of FIG. 8.

That is, driving the reverse logic signal /MIRROR High turns on the reverse mirror switches 5A2 through 5S2 which in turn complete all their electrical paths, whereby a reverse mirror circuit connection state is attained (for the front side chip). Conversely, bringing the reverse logic signal /MIRROR Low turns off the reverse mirror switches 5A2 through 5S2 which in turn break all their electrical paths.

The CSP mirror pair 60 in FIG. 10 adopts a connection wiring layer makeup equipped with a complementary mirror switch arrangement composed of mirror switches and reverse mirror switches. The arrangement allows each chip or each CSP to be switched for use either as a front side CSP or as a back side CSP. The two kinds of chips are manufactured throughout in the same production processes except for the last stage of package fabrication and assembly where the chips are switched for their respective uses. This feature contributes significantly to achieving the economies of mass production.

Each mirror switch 5 may illustratively be an analog switch composed of an ordinary CMOS transistor configuration (not shown). The control signals MIRROR and /MIRROR for control over the mirror and reverse mirror switches 5 in FIG. 10 may be provided as a MIRROR signal and its inverted form (/MIRROR signal) output by the paired mirror signal generating circuit shown in FIG. 11.

In the paired mirror signal generating circuit 70 of FIG. 11, a high-resistance 71 and a fuse 72 constitute a potential switching circuit that operates in one of two states: either the fuse remains intact or is blown. Depending on the state of the potential switching circuit, two inverters 73 and 74 output either the MIRROR signal or the /MIRROR signal.

When the fuse remains intact, the logic signal MIRROR is driven Low and the signal/MIRROR High. This turns on the reverse mirror switches (5A2 through 5S2) in FIG. 10, whereby a reverse mirror chip (i.e., front side CSP) is obtained. When the fuse is blown, the logic signal MIRROR is brought High and the signal /MIRROR Low. This turns on the mirror switches (5A1 through 5S1) in FIG. 10, whereby a mirror chip (i.e., back side CSP) is acquired.

The switching process of leaving the fuses intact or having them blown is selectively carried out illustratively during wafer tests on memory chips.

The major benefits of the present invention described above are summarized as follows:

According to the first aspect of the present invention, a pair of semiconductor packages having different connecting wiring means between the integrated circuits and the electrode bumps is constituted. One of the packages is usable as an ordinary package while the other one is usable as a mirror package.

According to the second aspect of the present invention, a plurality of rows of electrode pads are formed on the chip. The structure reduces the chip in size and thus diminishes the dimensions of the ordinary package as well as the mirror package using it. Since a common chip is used for an ordinary package as well as for a mirror package, the economies of mass production may be achieved.

According to the third aspect of the present invention, an ordinary package and a mirror package both having a common chip are connected on both side of the substrate. Through use of the structure, packaging density may be at least doubled.

According to the fourth aspect of the present invention, connection wiring means for connecting electrode pads with electrode bumps are formed outside the chip. This structure makes it easy to interconnect electrode pads in a plurality of rows in common chips, with electrode bumps in a plurality of rows in the ordinary and mirror packages.

According to the fifth aspect of the present invention, frame wires are provided inside the package for differently connecting electrode pads with electrode bumps. This structure also makes it easy to interconnect electrode pads in a plurality of rows in common chips, with electrode bumps in a plurality of rows in the ordinary and mirror packages.

According to the sixth aspect of the present invention, frame wires on one side are formed so that they pass alternately between contiguous electrode pads and/or between contiguous frame wires on the other side. This structure helps further reduce common chips in size or increases the number of rows of electrode pads in the chips.

According to the seventh aspect of the present invention, the wiring distances of frame wires are substantially equalized between the ordinary package and the mirror package. This structure smoothes out signal transmission delays and thus helps constitute a highly reliable package mirror pair.

According to the eighth aspect of the present invention, a plurality of rows of electrode pads are formed on the chip. The structure reduces the chip in size and thus diminishes the dimensions of the ordinary package as well as the mirror package using it. Since a common chip is used for an ordinary package as well as for a mirror package, the economies of mass production may be achieved.

According to the ninth aspect of the present invention, an ordinary package and a mirror package both having a common chip are connected on both side of the substrate. Through use of the structure, packaging density may be at least doubled.

According to the tenth aspect of the present invention, connection wiring means for connecting the integrated circuits of the chip with the electrode pads thereof are formed inside the chip. This structure makes it easy to interconnect electrode pads in a plurality of rows in common chips, with electrode bumps in a plurality of rows in the ordinary package and mirror package.

According to the eleventh aspect of the present invention, frame wires are included inside each chip for differently connecting the integrated circuits of the chip with the electrode bumps thereof. This structure also makes it easy to interconnect electrode pads in a plurality of rows in common chips, with electrode bumps in a plurality of rows in the ordinary and mirror packages.

According to the twelfth aspect of the present invention, the connection wiring layer are formed as a top layer in a plurality of wiring layers inside each chip. This structure reduces signal transmission delays, increases commonalties in manufacturing processes of chips for common use, and thereby helps constitute a highly reliable package mirror pair with minimized signal delays.

According to the thirteenth aspect of the present invention, connection wires are formed so that the wires on one side pass alternately between contiguous electrode pads and/or between contiguous connection wires on the other side. This structure helps further reduce common chips in size or increases the number of rows of electrode pads in the chips.

According to the fourteenth aspect of the present invention, the wiring distances of layered connection wires that connect the integrated circuits of each chip with the electrode bumps thereof are substantially equalized between the ordinary package and the mirror package. This structure smoothes out signal transmission delays and thus helps constitute a highly reliable package mirror pair.

According to the fifteenth aspect of the present invention, either switches or fuses are formed in the connection wiring layer between the integrated circuits of each chip and the electrode pads thereof. This structure allows common chips to be manufactured throughout in the same production processes except for the last stage where the chips are switched for ordinary and mirror uses. The structure further increases commonalties in manufacturing processes of chips for common use, and helps constitute a highly reliable package mirror pair in which signal transmission delays are further smoothed out between the ordinary and the mirror package.

According to the sixteenth aspect of the present invention, the connection wiring layer is furnished between the integrated circuits of each chip and the electrode pads thereof. Common chips are switched selectively for ordinary or mirror chip use after their fabrication by given a mirror signal or a reverse mirror signal respectively, whereby a package mirror pair is constituted.

According to the seventeenth aspect of the present invention, the number of rows of internal circuits, the number of rows of electrode pads, and the number of rows of electrode bumps are at most equal to the numbers of stages formed by the respective elements. This structure boosts area efficiency of the chips and packages and reduces their sizes as increases the number of the rows.

According to the eighteenth aspect of the present invention, the inventive semiconductor package may be constituted in such a manner that the number of rows of internal circuits, the number of rows of electrode pads, and the number of rows of electrode bumps in a multiple-row multiple-stage makeup are made the same. With ever-increasing numbers of such rows, this structure allows the connection wires to be formed in a regular and uniform fashion for enhanced reliability.

According to the nineteenth aspect of the present invention, the inventive semiconductor package may be constituted in such a manner that the layout pattern formed by internal circuits, electrode pads and electrode bumps in multiple rows and stages inside is limited to any one of a linear pattern, a grid pattern, a zigzag pattern and a cross-stitch pattern. With ever-increasing rows of such circuit elements, the structure boosts area efficiency and enhances connection wiring uniformity for chips and packages. In particular, this CSP structure also permits BGA structure packages to be formed.

According to the twelfth aspect of the present invention, the inventive semiconductor package may be constituted in such a manner that the number of rows of internal circuits, the number of rows of electrode pads, and the number of rows of electrode bumps in a multiple-row multiple-stage makeup are each limited to a minimum of two. This structure reduces the area of the package covered with a resin mold down to a size about the same as that of the chip.

Further, the present invention is not limited to these embodiments, but variations and modifications may be made without departing from the scope of the present invention.

The entire disclosure of Japanese Patent Application No. Hei 11-152851 filed on May 31, 1999 including specification, claims, drawings and summary are incorporated herein by reference in its entirety.

What is claimed is:

1. A semiconductor integrated circuit including a pair of semiconductor packages, comprising:
   a pair of chips provided in the semiconductor packages, respectively:
   a plurality of integrated circuits provided in each of the chips so as to be disposed in a plurality of rows and in a plurality of stages, each of said integrated circuits sending and receiving signals;
   a plurality of electrode pads provided on a principal plane of said chip so as to be disposed in a plurality of rows and in a plurality of stages, each of said electrode pads being connected to said integrated circuits;
   a plurality of electrode bumps provided on a surface of each of the semiconductor packages so as to be connected to said electrode pads to form external electrodes for said integrated circuits;
   wherein one of said pair of semiconductor packages is in a first state in which said electrode bumps are placed on predetermined positions while the other of said pair of semiconductor packages is in a second state in which said electrode bumps are flipped from corresponding positions in the first state;

said integrated circuits and said electrode bumps are interconnected differently between said first state and said second state, in such a manner that, when viewing from the principal plane, in a row J and a stage K of said pair of chips are all located identical integrated circuits and that the electrode bumps connected to the integrated circuits located in said row J and said stage K are all located symmetrically with respect to one another.

2. The semiconductor integrated circuit according to claim 1, wherein:

said pair of chips include two of identical chips;

the electrode pads connected to the integrated circuits located in said row J and said stage K are all located identical positions defined by the row J and the stage K on each surface of the pair of semiconductor packages;

the semiconductor package in the first state includes first connection wiring means for interconnecting said electrode pads and said electrode bumps; and the semiconductor package in the second state comprises second connection wiring means for interconnecting said electrode pads and said electrode bumps.

3. The semiconductor integrated circuit according to claim 2, further comprising a substrate sandwiched by the pair of semiconductor packages from a first and a second plane;

wherein the semiconductor package of the first state is connected to the substrate via the electrode bumps from the first plane;

the semiconductor package of the second state is connected to the substrate via the electrode bumps from the second plane; and the electrode bumps connected to the integrated circuits located in said row J and said stage K in the semiconductor package of the first state encounters the electrode bumps connected to those in the semiconductor package of the second state.

4. The semiconductor integrated circuit according to claim 2, wherein either said first connection wiring means or said second connection wiring means for interconnecting the electrode pads and electrode bumps is furnished within said semiconductor package outside said chip.

5. The semiconductor integrated circuit according to claim 2, wherein either said first connection wiring means or said second connection wiring means for interconnecting the electrode pads and electrode bumps comprises frame wiring furnished within said semiconductor package outside said chip.

6. The semiconductor integrated circuit according to claim 5, wherein said frame wiring for interconnecting the electrode pads and electrode bumps includes at least one frame wire aligned between adjacent electrode pads and/or between adjacent frame wires.

7. The semiconductor integrated circuit according to claim 5 wherein said frame wiring for interconnecting the electrode pads and electrode bumps is formed in such a manner that wiring distances between said electrode pads and said electrode bumps are made substantially the same between the pair of semiconductor packages.

8. The semiconductor integrated circuit according to claim 1, wherein:

said pair of chips include two of identical chips;

the electrode pads connected to the integrated circuits located in said row J and said stage K are all located symmetrically with respect to one another;

the semiconductor package in the first state includes third connection wiring means for interconnecting said integrated circuits and said electrode pads; and the semiconductor package in the second state comprises fourth connection wiring means for interconnecting said integrated circuits and said electrode pads.

9. The semiconductor integrated circuit according to claim 8, further comprising a substrate sandwiched by the pair of semiconductor packages from a first and a second plane;

wherein the semiconductor package of the first state is connected to the substrate via the electrode bumps from the first plane;

the semiconductor package of the second state is connected to the substrate via the electrode bumps from the second plane; and the electrode bumps connected to the integrated circuits located in said row J and said stage K in the semiconductor package of the first state encounters the electrode bumps connected to those in the semiconductor package of the second state.

10. The semiconductor integrated circuit according to claim 8, wherein either said third connection wiring means or said fourth connection wiring means for interconnecting the integrated circuits and electrode pads is furnished inside said chip.

11. The semiconductor integrated circuit according to claim 10, wherein either said third connection wiring means or said fourth connection wiring means for interconnecting the integrated circuits and electrode pads comprises a connection wiring layer furnished inside said chip.

12. The semiconductor integrated circuit according to claim 11, wherein said connection wiring layer inside said chip for interconnecting the integrated circuits and electrode pads is formed as a top layer in a plurality of wiring layers inside said chip.

13. The semiconductor integrated circuit according to claim 11, wherein said connection wiring layer inside said chip for interconnecting the integrated circuits and electrode pads comprises at least one connection wire located between adjacent integrated circuits and/or between adjacent connection wires.

14. The semiconductor integrated circuit according to claim 11, wherein said connection wiring layer inside said chip for interconnecting the integrated circuits and electrode pads is formed in such a manner that wiring distances between said integrated circuits and said electrode pads are made substantially the same between said pair of semiconductor packages.

15. The semiconductor integrated circuit according to claim 8, wherein either said third connection wiring means or said fourth connection wiring means for interconnecting the integrated circuits and electrode pads includes either switches or fuses for changing ways in which said integrated circuits and said electrode pads are interconnected.

16. The semiconductor integrated circuit according to claim 15, wherein either said switches or said fuses are formed in said connection wiring layer furnished inside said chip and are controlled by a mirror signal generating circuit capable of generating a mirror signal and a reverse mirror signal for changing ways in which said integrated circuits and said electrode pads are interconnected.

17. The semiconductor integrated circuit according to claim 1, wherein the number of rows formed by said integrated circuits, the number of rows formed by said electrode pads, and the number of rows formed by said electrode bumps are at most equal to those of stages constituted thereby.

18. The semiconductor integrated circuit according to claim 1, wherein the number of rows formed by said integrated circuits, the number of rows formed by said electrode pads, and the number of rows formed by said electrode bumps are made the same.

19. The semiconductor integrated circuit according to claim 1, wherein a layout pattern formed by said electrode pads and said electrode bumps in rows and stages is any one of a linear pattern, a grid pattern, a zigzag pattern and a cross-stitch pattern.

20. The semiconductor integrated circuit according to claim 1, wherein:
  said integrated circuit, said electrode pads and said electrode bumps are made so as to be disposed at least in two rows, respectively; and
  said semiconductor packages comprises a resin mold having substantially the same size as that of said chip and covering the same.

* * * * *